(12) United States Patent
Van De Kerkhof et al.

(10) Patent No.: US 8,068,212 B2
(45) Date of Patent: Nov. 29, 2011

(54) LITHOGRAPHIC APPARATUS CONFIGURED TO COMPENSATE FOR VARIATIONS IN A CRITICAL DIMENSION OF PROJECTED FEATURES DUE TO HEATING OF OPTICAL ELEMENTS

(75) Inventors: Marcus Adrianus Van De Kerkhof, GT Helmond (NL); M'Hamed Akhssay, GV Helmond (NL); Mamoun El Ouasdad, WG Culemborg (NL); Asis Uasghiri, LZ Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/892,733

(22) Filed: Sep. 28, 2010

(65) Prior Publication Data

US 2011/0013163 A1  Jan. 20, 2011

Related U.S. Application Data

(63) Continuation of application No. 11/713,787, filed on Mar. 5, 2007, now Pat. No. 7,829,249.

(51) Int. Cl.
*G03B 27/74* (2006.01)
*G03B 27/42* (2006.01)

(52) U.S. Cl. ............ 355/68; 355/53; 382/145; 382/149; 430/30

(58) Field of Classification Search ............... 355/53, 355/68; 382/145, 149; 430/30
See application file for complete search history.

(56) References Cited

U.S. PATENT DOCUMENTS

| 6,416,913 | B1 | 7/2002 | Suzuki |
| 6,504,597 | B2 | 1/2003 | Schuster et al. |
| 6,552,776 | B1 | 4/2003 | Wristers et al. |
| 6,783,903 | B2 | 8/2004 | Choi |
| 6,873,938 | B1 | 3/2005 | Paxton et al. |
| 7,626,684 | B2 | 12/2009 | Jeunink et al. |
| 7,829,249 | B2 * | 11/2010 | Van De Kerkhof et al. .... 430/30 |
| 2005/0254024 | A1 | 11/2005 | Van Greevenbroek et al. |
| 2008/0252870 | A1 | 10/2008 | Jeunink et al. |

FOREIGN PATENT DOCUMENTS

| CN | 1629729 A | 6/2005 |
| EP | 0 823 662 A2 | 2/1998 |
| EP | 1 014 187 A2 | 6/2000 |
| EP | 1 014 187 A3 | 6/2002 |
| EP | 1 014 187 B1 | 11/2006 |
| JP | 02-106917 A | 4/1990 |
| JP | 06-232029 A | 8/1994 |
| JP | 8-221261 A | 8/1996 |
| JP | 09-162106 A | 6/1997 |
| JP | 10-064790 A | 3/1998 |
| JP | 2000-195771 A | 7/2000 |
| JP | 2000-232049 A | 8/2000 |
| JP | 2001-196305 A | 7/2001 |
| JP | 2005-116848 A | 4/2005 |
| JP | 2005-183747 A | 7/2005 |

OTHER PUBLICATIONS

Chinese Office Action mailed Apr. 2, 2010 for Chinese Application No. 200810083206.X, 3 pgs.
English Abstract of Japanese Publication No. JP 8-221261A published Aug. 30, 1996, 1 pg.
Chris A. Mack, et al., "Controlling Focus and Dose (Part II—Centering the Process X Window)", KLA-Tencor Corporation.
Donis G. Flagello, et al., "Optimizing and Enhancing Optical Systems to Meet the Low X K1 Challenge", Optical Microlithography XVI, Proceedings of SPIE, vol. 5040, pp. 139-150 (2003).
Non-Final Rejection mailed Mar. 23, 2010 for U.S. Appl. No. 11/713,787, 6 pgs.
English Language Abstract for JP 02-106917 A, published Apr. 19, 1990; 1 page.
English Language Abstract for JP 06-232029 A, published Aug. 19, 1994; 1 page.
English Language Abstract for JP 09-162106 A, published Jun. 20, 1997; 1 page.
English Language Abstract for JP 10-064790 A, published Mar. 6, 1998; 1 page.
English Language Abstract for JP 2000-195771 A, published Jul. 14, 2000; 1 page.
English Language Abstract for JP 2000-232049 A, published Aug. 22, 2000; 1 page.
English Language Abstract for JP 2001-196305 A, published Jul. 19, 2001; 2 pages.
English Language Abstract for JP 2005-116848 A, published Apr. 28, 2005; 1 page.
English Language Abstract for JP 2005-183747 A, published Jul. 7, 2005; 2 pages.
English Translation of Notice of Reasons for Rejection directed to related Japanese Patent Application No. 2008-045567, mailed on Dec. 20, 2010 from the Japanese Patent Office; 4 pages.
Notice of Allowance directed to related U.S. Appl. No. 11/713,787, filed Mar. 5, 2007, mailed Sep. 17, 2010; 4 pages.

* cited by examiner

*Primary Examiner* — Christopher Young
(74) *Attorney, Agent, or Firm* — Sterne, Kessler, Goldstein & Fox P.L.L.C.

(57) ABSTRACT

A lithographic apparatus configured to apply corrections to the dose, within and/or between fields, to compensate for critical dimension variations due to heating of elements of the projection system is disclosed.

15 Claims, 3 Drawing Sheets

LITHOGRAPHIC APPARATUS CONFIGURED TO COMPENSATE FOR VARIATIONS IN A CRITICAL DIMENSION OF PROJECTED FEATURES DUE TO HEATING OF OPTICAL ELEMENTS

CROSS-REFERENCE TO RELATED APPLICATIONS

This application is a Continuation of U.S. application Ser. No. 11/713,787 (now issued as U.S. Pat. No. 7,829,249) filed on Mar. 5, 2007 by VAN DE KERKHOF, Marcus Adrianus et al., entitled DEVICE MANUFACTURING METHOD, COMPUTER PROGRAM AND LITHOGRAPHIC APPARATUS, the entire contents of which is hereby incorporated by reference and for which priority is claimed under 35 U.S.C. §120.

BACKGROUND OF THE INVENTION

1. Field of the Invention

The present invention relates to a lithographic apparatus and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

It is well-known in the art of projection lithography that during exposures, elements in the projections system absorb radiation, heat-up and therefore introduce aberrations into the projections system, resulting in reduced image quality at substrate level. These effects are particularly acute when using illumination modes, such as dipole illumination and quadrupole illumination, in which the intensity distribution in the pupil plane of the illumination system and/or deep ultraviolet radiation (DDV), e.g. at 198, 157 or 126 nm, since the choice of materials from which lenses useable with these wavelengths can be made is quite limited and even the best materials have significant coefficients of absorption at those wavelengths. The problem particularly affects projection systems formed by refractive lens elements and is therefore often referred to as lens heating. Even with cooling systems to maintain the projection system at a constant temperature, sufficient local temperature variations can occur to cause noticeable loss of imaging quality.

Therefore, many projection S systems in lithographic projection apparatus are provided with one or more actuated adjustable elements whose shape, position and/or orientation in one or more degrees of freedom can be adjusted during or between exposures to compensate for lens heating effects. A computer model predicts the lens heating effects that are expected and calculates appropriate corrections to be effected by the adjustable elements. Prior art computer models have calculated the lens heating effects in terms of Zernike polynomials describing the aberrations in the pupil plane of the projection system and applied corrections via control "knobs" on the projection system that adjust one or more adjustable elements to give a correction corresponding to the relevant Zernike polynomial. However, prior art lens heating correction methods have not always been completely effective and some residual aberrations often occur.

Other attempts to deal with the problem of non-uniform lens heating include the provision of additional light sources, e.g. infra-red, to heat the "cold" parts, i.e. those not traversed by the intense parts of the projection beam, of elements of the projection system, see U.S. Pat. No. 6,504,597 and JP-A-08-221261. The former reference addresses non-uniform heating caused by a slit-shaped illumination field and the latter references addresses non-uniform heating caused by zonal or modified illumination. The provision of such additional light sources and guides to conduct the additional heating radiation to the correct places may increase the complexity of the apparatus and the increased heat load in the projection system necessitates the provision of a cooling system of higher capacity.

BRIEF SUMMARY OF THE INVENTION

It is desirable to provide an improved method for at least reducing or mitigating the effects of non-uniform heating of elements of a projection system.

According to an embodiment of the invention, there is provided a device manufacturing method in which an image of a given pattern including features having a critical dimension is projected onto a substrate using a projection system having at least one optical element that is sensitive to heat, the method including determining variations in the critical dimension of the features that would be expected to occur when projecting the image at a nominal dose due to heating of the optical element; determining dose corrections to vary the critical dimension of the features to at least partially compensate for the expected variations in the critical dimension; and projecting an image of the pattern onto the substrate whilst applying the determined dose corrections.

According to an embodiment of the invention, there is provided a computer program product including instructions recorded on a computer-readable medium, the instructions being such as to control a lithographic apparatus, having a projection system having at least one optical element that is sensitive to heat, to perform a device manufacturing method in which an image of a given pattern including features having a critical dimension is projected onto a substrate, the method including determining variations in the critical dimension of the features that would be expected to occur when projecting the image at a nominal dose due to heating of the optical element; determining dose corrections to vary the critical dimension of the features to at least partially compensate for the expected variations in the critical dimension; and projecting an image of the pattern onto the substrate whilst applying the determined dose corrections.

According to an embodiment of the invention, there is provided a lithographic apparatus including: an illumination system configured, to condition a radiation beam so as to illuminate a patterning device; a support constructed to support the patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, the projection system having at least one optical element that is sensitive to heat; and a control system configured to control the illumination system, the support and the substrate table to project images of the pattern onto a substrate using a corrected dose that differs from a nominal dose by an amount determined to compensate for variations in a critical dimension of projected features due to heating of the optical element, wherein the control system is configured and arranged to apply dose corrections to the image by controlling at least one of the group consisting of: an output of a radiation source, a variable attenuator, an exposure duration, a device configured to vary intensity of a radiation beam across a length of an illumination slit, a width of an illumination slit, a scan speed, movement, within a field of the image, of a neutral density filter having a non-uniform absorption pattern, and a dynamically-adjustable slit.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
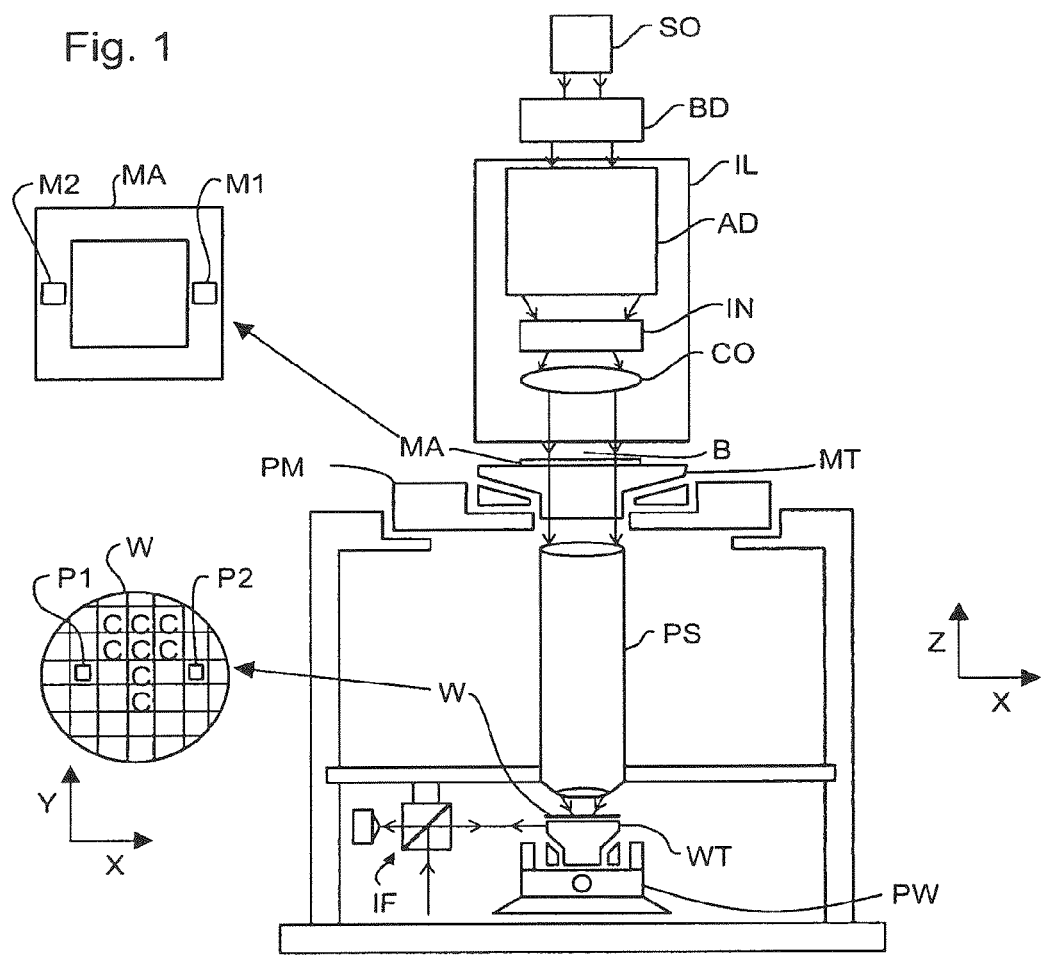
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable ICD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of as type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
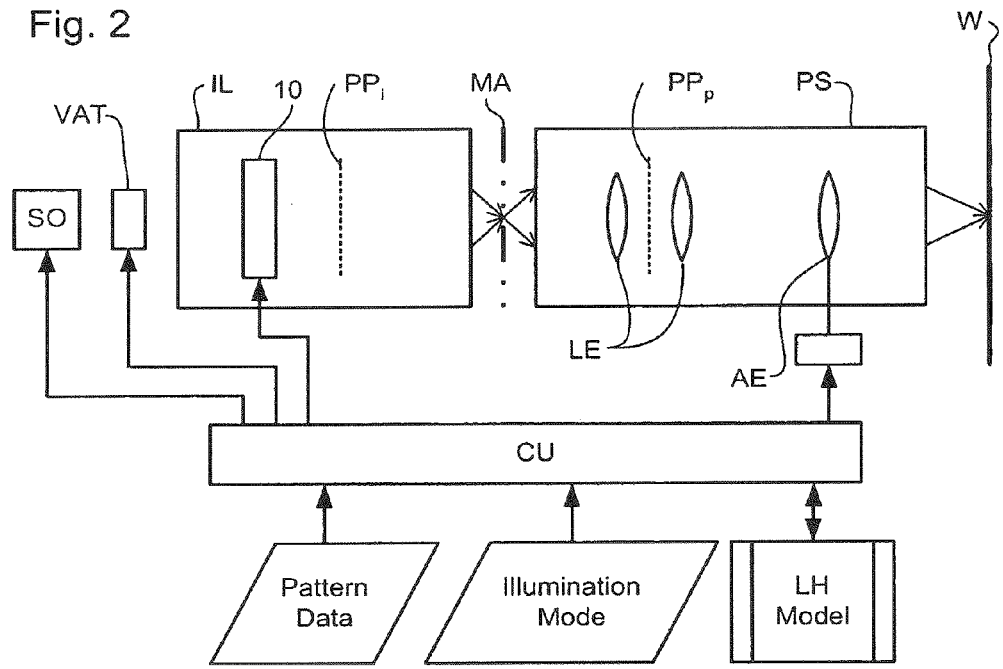
FIG. 2 depicts the optical arrangements of the apparatus of FIG. 1.

FIG. 2 depicts the basic optical arrangement of the apparatus of FIG. 1. It uses Koehler illumination whereby a pupil plane PPj in the illumination system IL is a Fourier transform plane of the object plane in which the patterning device MA is located and is conjugate to a pupil plane PPp (the projection system may have more than one pupil plane) of the projection system PS. As is conventional, illumination modes of this apparatus can be described by reference to the distribution of intensity of the radiation of the projection beam in the pupil plane PPj of the illumination system. It will be understood that the distribution of intensity in the pupil plane PPp of the projection system PS will be the same as the distribution of intensity in the pupil plane PPj of the illumination system, subject to diffraction effects of the pattern present in patterning device MA.

For a pattern consisting essentially of lines in one direction, good imaging and a large process window can be obtained by use of dipole illumination in which the poles are arranged such that in the pupil plane PPp of the projection system, one of the first order diffracted beams deriving from each of the two poles in the illumination system coincides with the zeroth order beam deriving from the other pole. The other first order beams and higher order beams are not captured by the projection system. It will thus be appreciated that the energy of the projection beam is strongly localized in the projection system PS, at least in elements close to the pupil plane(s). This localization of the intensity causes localized heating, which often changes over time, of elements LE of the projection system which may give rise to aberrations in the projection system PS that are not correctable by known adjustable lens elements AE.

In many cases, lens heating causes changes in the position of the plane of best focus relative to its nominal position, leading to focus errors, commonly termed defocus, in the projected image. These errors may vary across a field, between fields on a single substrate and between substrates in a single batch or lot. Variations between fields and between substrates may be caused by variation in the lens heating effects over time; variations within a field may be inherent in the lens heating effects themselves (i.e. changes in the shape of the plane of best focus rather than merely its position) and/or due to the pattern being projected.

Within a certain range, defocus manifests in the printed image as a variation in the dimensions of the printed features, in particular those printed at the critical dimension (CD) which are generally the most important features in a pattern. According to an embodiment of the present invention, it is proposed to vary the dose delivered to the substrate to compensate for lens heating effects. Within a certain range, similar to the range over which defocus manifests as a change in CD, changes in dose cause changes in CD. The exact relationship between dose and CD is, in general dependent on parameters of the pattern being exposed, in particular pitch. Thus CD variation caused by lens heating effects can be corrected for by compensatory changes in dose. This approach contrasts with prior art approaches to dealing with lens heating, which have involved either thermal control of the projection system—e.g. cooling systems and additional heating to reduce temperature gradients in affected elements—or optical corrections—e.g. using adjustable optical elements to introduce compensatory aberrations.

Dose at substrate level can be controlled in a number of ways. In a stepper, dose can be controlled across the whole field by controlling the output of the radiation source, using a variable attenuator VAT or changing the exposure duration. In a scanner, or step-and-scan lithography apparatus, dose can also be controlled within the field. In the scan direction (e.g. Y), dose variation can be effected by varying the output of the radiation source, the setting of a variable attenuator, the width of the illumination slit or the scan speed during the scan.

Figure 3:
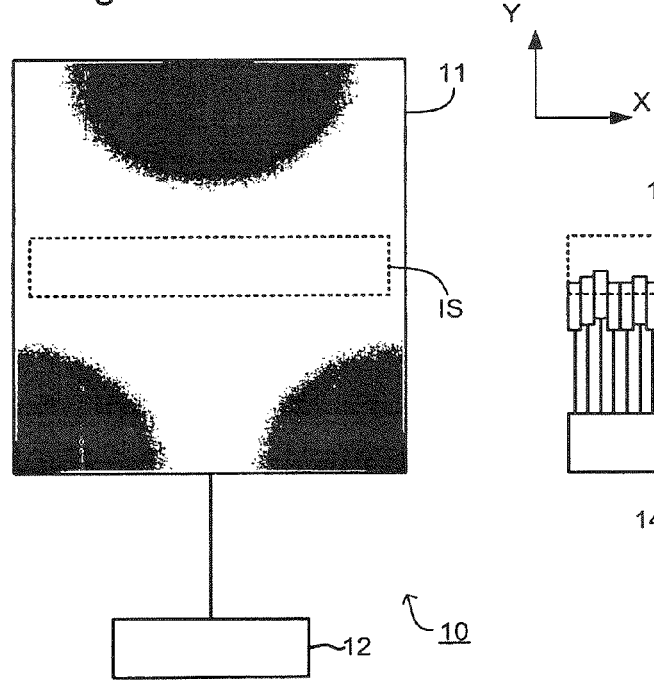
FIG. 3 depicts a device configured to vary the intensity of a radiation beam across the length of the illumination slit according to an embodiment of the invention.
Figure 4:
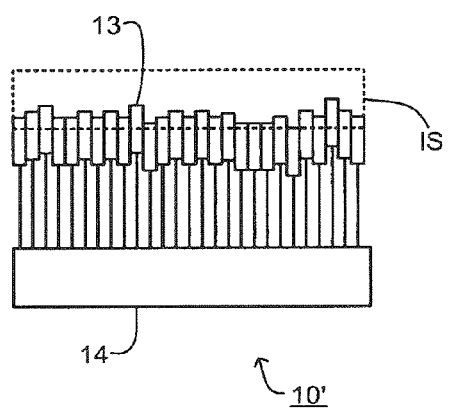
FIG. 4 depicts a device configured to vary the dose delivered at substrate level across the length of the illumination slit according to an embodiment of the invention.

In the perpendicular direction (e.g. X) several devices are available to provide a dose variation. One dose variation device 10, shown in FIG. 3, includes a neutral density filter 11 which has a non-uniform absorption pattern. It is moved by actuator 12 relative to the illumination slit IS so as to give an intensity variation across the length of the slit. The range of intensity variations that can be effected by this device is limited but by appropriate selection of the absorption pattern of the filter 11, a useful, if not always perfect, correction for expected lens heating effects can be effected. Another dose variation device 10' is shown in FIG. 4. This is known as a dynamically adjustable slit and includes a plurality of fingers 13 which can be individually and controllably extended into the illumination slit from one or both sides thereof by an actuation system 14. The fingers can be opaque or partially absorbing, optionally with a transmission gradient in the direction (Y) perpendicular to the length of the slit (X). The fineness of the correction achievable by this method is determined by the width of the fingers 13 and so can be set as desired. A variation of the dynamically adjustable slit that is particularly useful for EUV uses wires or vanes extending across the slit and whose position, orientation and/or effective width can be varied. In this variation, the wires or vanes are put at a position along the beam path so that they are out of focus on the patterning device.

Figure 5:
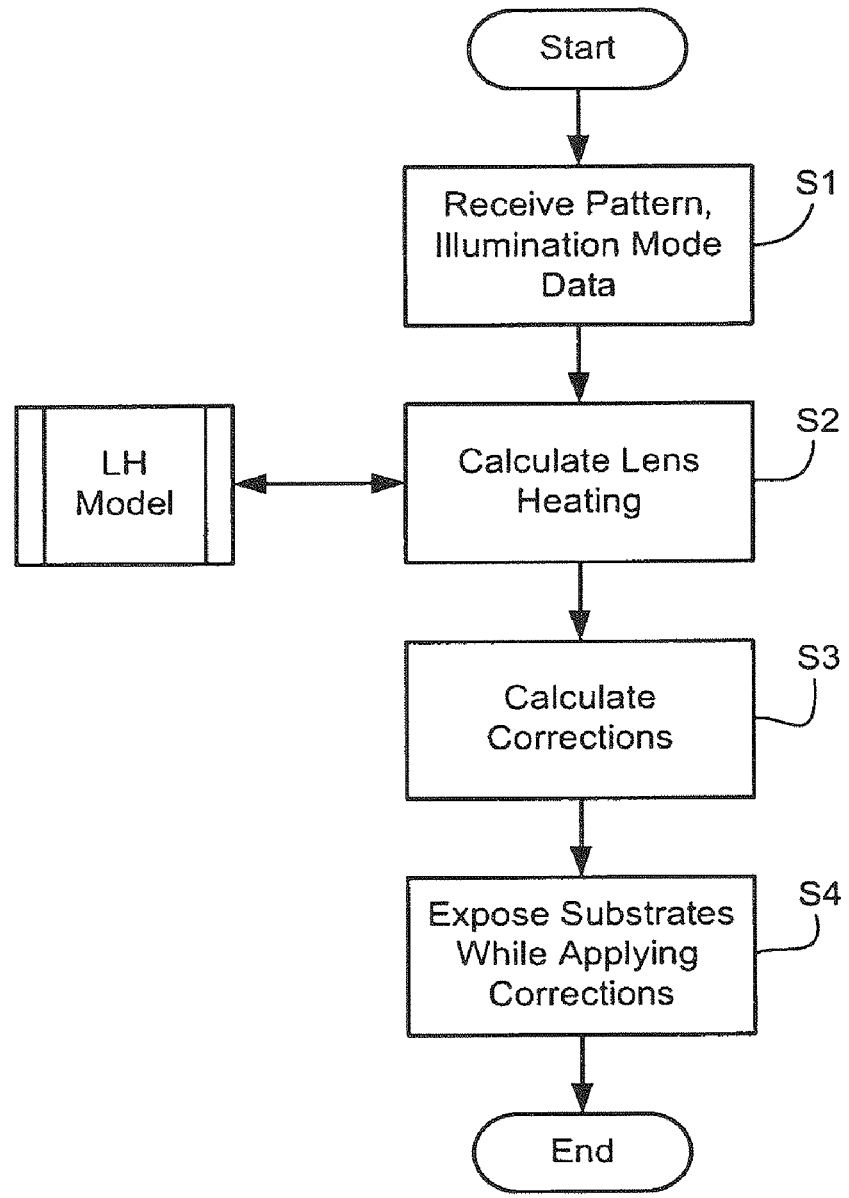
FIG. 5 depicts a device manufacturing method according to an embodiment of the invention.

FIG. 2 shows schematically the optical and control arrangements of the lithographic apparatus embodiment of FIG. 1 in accordance with an embodiment of the present invention. FIG. 5 shows a device manufacturing method according to an embodiment of the invention. First, pattern data, relating to a pattern to be imaged, and illumination mode data, relating to an illumination mode to be used, are received SI by a control unit CD which calculates S2 the lens heating effects that are to be expected, which may vary over time during exposure of a substrate or batch of substrates, e.g. by reference to a lens heating model (LH model). Optionally, the illumination mode to be used may be calculated or selected by the control unit on the basis of the pattern data.

Next, the control unit CD calculates S3 corrections to be applied to compensate for the lens heating effects. These corrections may be applied by any available adjustable lens elements AE the projection system and by adjusting the dose, as described further below, taking into account whatever other corrections are required to apply to compensate for any other forms of error in the apparatus or the process to be carried out on the substrates. The division of corrections between adjustable elements AE and dose will depend on the capabilities of the adjustable elements AE and other corrections to be applied. It may be desirable, for example, to effect primary corrections with adjustable elements AE and residual corrections with dose variations. Once the appropriate corrections are determined, the substrates are exposed S4 with the appropriate dose. It should be noted that blocks S1 to S3 may be performed off-line in advance of the exposure S4 to maximize throughput and may be performed by a computer separate from the lithographic apparatus with the corrections being communicated to the lithographic apparatus by network or data carrier.

Application of the dose variations may be facilitated by DoseMapper™ software available from ASML Netherlands B.V., of Veldhoven, The Netherlands, which is configured to apply a desired dose profile to exposures of substrates. The dose variations calculated according to an embodiment of the invention may be combined with other dose variations required to compensate for other effects. For example external causes of CO non-uniformity which may be measured by in-line CD metrology.

In a variation of the method, appropriate corrections can be derived empirically. Appropriate test structures are added to the pattern which is printed on a batch of substrates and their critical dimensions monitored for variation across each substrate and between substrates of the batch. A correlation between lens heating over time and CD variation can then be determined and appropriate corrections to be applied by dose variation can be derived.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (ICDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to anyone or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam so as to illuminate a patterning device;
    a support constructed to support the patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate, the projection system having at least one optical element that is sensitive to heat; and
    a control system configured to control the illumination system, the support and the substrate table to project images of the pattern onto a substrate using a corrected dose that differs from a nominal dose by an amount determined to compensate for variations in a critical dimension of projected features due to heating of the optical element,
    wherein the control system is configured and arranged to apply dose corrections to the image by controlling at least one of the group consisting of:
    an output of a radiation source,
    a variable attenuator,
    an exposure duration,
    a device configured to vary intensity of a radiation beam across a length of an illumination slit,
    a width of an illumination slit,
    a scan speed,
    movement, within a field of the image, of a neutral density filter having a non-uniform absorption pattern, and
    a dynamically-adjustable slit.

2. A system according to claim 1, wherein the projection system is configured and arranged to project an image of the pattern onto a plurality of separate target portions on the substrate using at least one dose correction for each target portion.

3. A system according to claim 1, wherein the projection system is configured and arranged to project an image of the pattern onto a plurality of separate substrates using at least one dose correction for each substrate.

4. A system according to claim 1, wherein the control system is configured and arranged to apply dose corrections that vary across the image.

5. A system according to claim 1, wherein the control system is configured and arranged to apply dose corrections to the image by controlling the output of the radiation source.

6. A system according to claim 1, wherein the control system is configured and arranged to apply dose corrections to the image by controlling the variable attenuator.

7. A system according to claim 1, wherein the control system is configured and arranged to apply dose corrections to the image by controlling the exposure duration.

8. A system according to claim 1, wherein the control system is configured and arranged to apply dose corrections to the image by varying the intensity of the radiation beam across the length of the illumination slit.

9. A system according to claim 1, wherein the control system is configured and arranged to apply dose corrections to the image by controlling the width of the illumination slit.

10. A system according to claim 1, wherein the control system is configured and arranged to apply dose corrections to the image by controlling the scan speed.

11. A system according to claim 1, wherein the control system is configured and arranged to apply dose corrections to the image by controlling the movement, within the field of the image, of the neutral density filter having the non-uniform absorption pattern.

12. A system according to claim 1, wherein the control system is configured and arranged to apply dose corrections to the image by controlling the dynamically adjustable slit.

13. A system according to claim 12, wherein the dynamically adjustable slit includes a plurality of fingers.

14. A system according to claim 13, wherein the plurality of fingers are opaque.

15. A system according to claims 13, wherein the plurality of fingers are partially absorbing.

* * * * *

UNITED STATES PATENT AND TRADEMARK OFFICE
CERTIFICATE OF CORRECTION

PATENT NO. : 8,068,212 B2  Page 1 of 1
APPLICATION NO. : 12/892733
DATED : November 29, 2011
INVENTOR(S) : Marcus Adrianus Van De Kerkof It is certified that error appears in the above-identified patent and that said Letters Patent is hereby corrected as shown below:

Title Page, Item (75), Inventors section please delete "GT Helmond" and insert --Helmond--.
Title Page, Item (75), Inventors section please delete "GV Helmond" and insert --Helmond--.
Title Page, Item (75), Inventors section please delete "WG Culemborg" and replace with "Culemborg".
Title Page, Item (75), Inventors section please delete "LZ Rotterdam" and replace with "Rotterdam".

Signed and Sealed this
Fourteenth Day of February, 2012

David J. Kappos
*Director of the United States Patent and Trademark Office*